United States Patent
Lai et al.

(10) Patent No.: US 6,825,498 B2
(45) Date of Patent: Nov. 30, 2004

(54) WHITE LIGHT LED

(75) Inventors: Mu-Jen Lai, Hsinchu (TW);
Chia-Cheng Liu, Hsinchu (TW);
Chiung-Yu Chang, Hsinchu (TW)

(73) Assignee: Vtera Technology Inc., Hsinchu (TW)

( * ) Notice: Subject to any disclaimer, the term of this patent is extended or adjusted under 35 U.S.C. 154(b) by 0 days.

(21) Appl. No.: 10/603,659

(22) Filed: Jun. 26, 2003

(65) Prior Publication Data

US 2004/0173805 A1 Sep. 9, 2004

(30) Foreign Application Priority Data

Mar. 4, 2003 (TW) .......................... 92104599 A

(51) Int. Cl.[7] .................... H01L 29/22; H01L 29/221; H01L 29/24
(52) U.S. Cl. .............................. 257/94; 257/96; 257/102
(58) Field of Search ............................. 257/85, 94, 96, 257/99, 102

(56) References Cited

U.S. PATENT DOCUMENTS 5,998,925 A * 12/1999 Shimizu et al. ............. 313/503
6,528,395 B2 * 3/2003 Nakamura .................. 438/478

* cited by examiner

*Primary Examiner*—Ngân V. Ngô
(74) *Attorney, Agent, or Firm*—Rabin & Berdo, P.C.

(57) ABSTRACT

The present invention discloses a light emitting diode (LED) by using a P-type ZnTe layer or a ZnSe layer as a substrate. To match the lattice between the substrate and blue light LED of cubic crystal, a BP(boron phosphide) buffer layer of single crystal is formed on the substrate. When the blue light LED emits blue light of wavelength from 450 nm to 470 nm, the ZnTe or ZnSe substrate absorbs the blue light and emits yellow-green light of wavelength 550 nm. Thus, white light is produced by mixing the blue light and the yellow-green light.

10 Claims, 2 Drawing Sheets

WHITE LIGHT LED

This application claims the benefit of Taiwan application Serial No. 092104599, filed Jan. 16, 2003.

BACKGROUND OF THE INVENTION

1. Field of the Invention

The invention relates in general to a light emitting diode (LED), and in particular, to an LED having a BP (boron phosphide) buffer layer of single crystal structure on a ZnTe or ZnSe substrate to facilitate the epitaxy of a blue light LED of cubic crystal structure on the BP buffer layer.

2. Description of the Related Art

The light emitting diode (LED), with the characteristics of small volume, light weight, high efficiency, and long life, has seen great advances in different monochromatic color output, such as red, blue, and green. Single color LED's can be used as a backlight in a special display, for instance, mobile phones and light crystal displays (LCDs). Nowadays, many researches are being carried out on white LEDs in order to develop illumination apparatus with higher efficiency than traditional incandescent and fluorescent devices.

FIG. 1 shows the cross section of an LED of lateral-electrode type, wherein the P-type electrode and N-type electrode are positioned on the same side of the substrate. A first cladding layer, such as N-type GaN layer 11, is on a substrate of sapphire layer 10. The LED further comprises a buffer layer, not shown in the figure, between the substrate 10 and the first cladding layer 11. An active layer, such as GaInN layer 12, is on the first cladding layer 11. A second cladding layer of P-type GaN layer 13 is on the active layer 12. An N-type electrode 14 and a P-type electrode 15 are respectively on the first cladding layer 11 and the second cladding layer 13.

U.S. Pat. No. 5,998,925 discloses a white color LED, wherein the stack structure described in the previous paragraph is packaged with a phosphor, like a YAG phosphor 16. The blue light emitted from the active layer is partially absorbed by the YAG phosphor 16. The unabsorbed blue light is mixed with yellow light emitted from YAG phosphor 16, and thus the white light is produced with this mixing.

However, the quality of the white light produced is not satisfactory if the intensity ratio between the blue light and the yellow light is not equal. To form the phosphor layer covering the stack structure greatly increases the cost of the packaging. Moreover, the cost also increases because the substrate of sapphire layer 10 is insulation and the N-type electrode has to be formed on the first cladding layer by an additional etching step.

To resolve the issues described above, an LED of vertical-electrode type has been developed and is shown in FIG. 2, wherein the P-type electrode 28 and N-type electrode 21 are positioned on the different side of substrate. Moreover, the substrate, such as an N-type SeZn substrate 22 of FIG. 2, is capable of transferring the wavelength of the light source. On the N-type SeZn substrate 22, there are an N-type ZnSe buffer layer 23, an N-type SeSMgZn cladding layer 24, a ZnCdSe active layer 25, a P-type SeSMgZn cladding layer 26, and a P-type contact layer 27 in order. The N-type ZnSe buffer layer 23 is mainly used to match the lattice between the N-type SeZn substrate 22 and the N-type SeSMgZn cladding layer 24. Both the N-type SeSMgZn cladding layer 24 and the P-type SeSMgZn cladding layer 26 have a broader band gap then the ZnCdSe active layer 25. Therefore, the electrons produced in the ZnCdSe active layer 25 are limited therein.

The LED of FIG. 2 further comprises an N-type electrode 21 formed on the N-type SeZn substrate 22 and a P-type electrode 28 formed on the P-type contact layer 27. When appropriate voltages are applied to the N-type electrode 21 and the P-type electrode 28, the ZnCdSe active layer 25 located on the P-N junction will emit blue light. The blue light is partially absorbed by the N-type SeZn substrate 22, from which yellow light is emitted. Part of the blue light, unabsorbed by the N-type SeZn substrate 22, is mixed with the yellow light, and thus white light is produced.

Compared with the LED of lateral-electrode type, the LED of vertical-electrode type requires a simpler manufacturing process, wherein the steps of etching for electrodes and forming phosphor on the stack structure can be omitted. However, the LED of vertical-electrode type has a lower efficiency of emitting white light than the LED of lateral-electrode type.

Therefore, the present invention provides another LED structure for the vertical-electrode type by using a P-type ZnTe layer or a ZnSe layer as a substrate. To ensure lattice match between the substrate and the blue light LED of cubic crystal, a buffer layer of single crystal is firstly formed on the substrate. Thus the efficiency of white light emission is greatly improved. Moreover, the present invention improves the quality of white light because blue light of wavelength from 450 nm to 470 nm is emitted from the blue light LED of cubic crystal on the buffer layer, and yellow light of 550 nm is emitted from the substrate after the substrate absorbs the blue light.

SUMMARY OF THE INVENTION

It is therefore an object of the invention to provide a light emitting diode (LED) structure of vertical-electrode type.

Another object of the present invention is to provide an LED structure comprising a P-type ZnTe layer or a ZnSe layer as a substrate. A BP buffer layer of single crystal is positioned on the substrate, such that the lattice match between the substrate and the blue light LED of cubic crystal can be improved.

On the substrate, a BP buffer layer, a first type GaN cladding layer, an active layer and a second type GaN cladding layer are stacked in order. A first type electrode and a second type electrode are positioned below the substrate and on the second type GaN cladding layer respectively. The first type GaN cladding layer is opposite the second type GaN cladding layer in conducting type, the first type electrode is also opposite the second type electrode in conducting type. The substrate, the BP buffer layer, the first type electrode and the first type GaN cladding layer are of the same conducting type.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
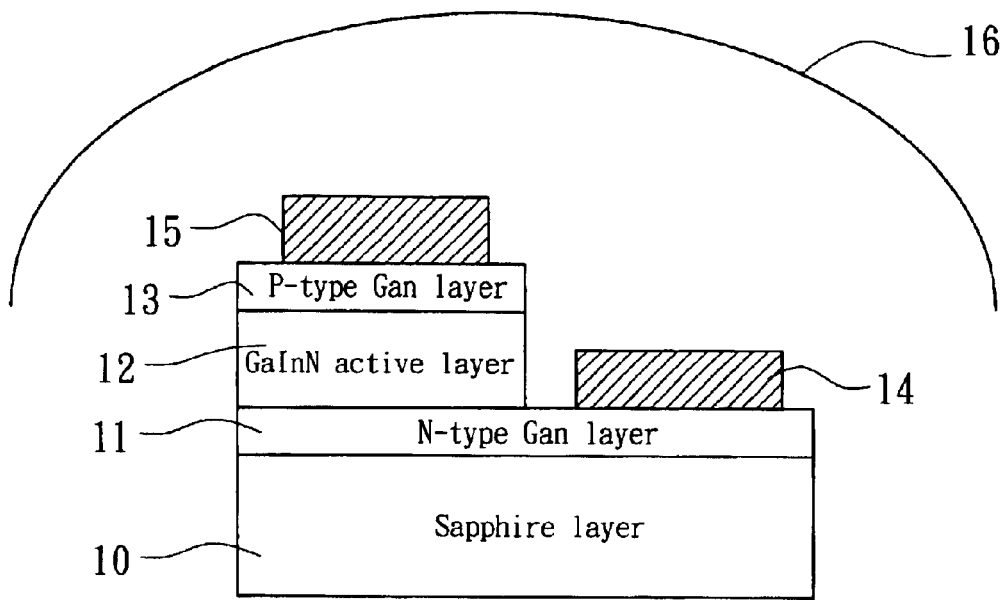
FIG. 1 (Prior Art) shows the cross section of LED of lateral-electrode type, wherein the P-type electrode and N-type electrode are formed on the same side of the substrate.
Figure 2:
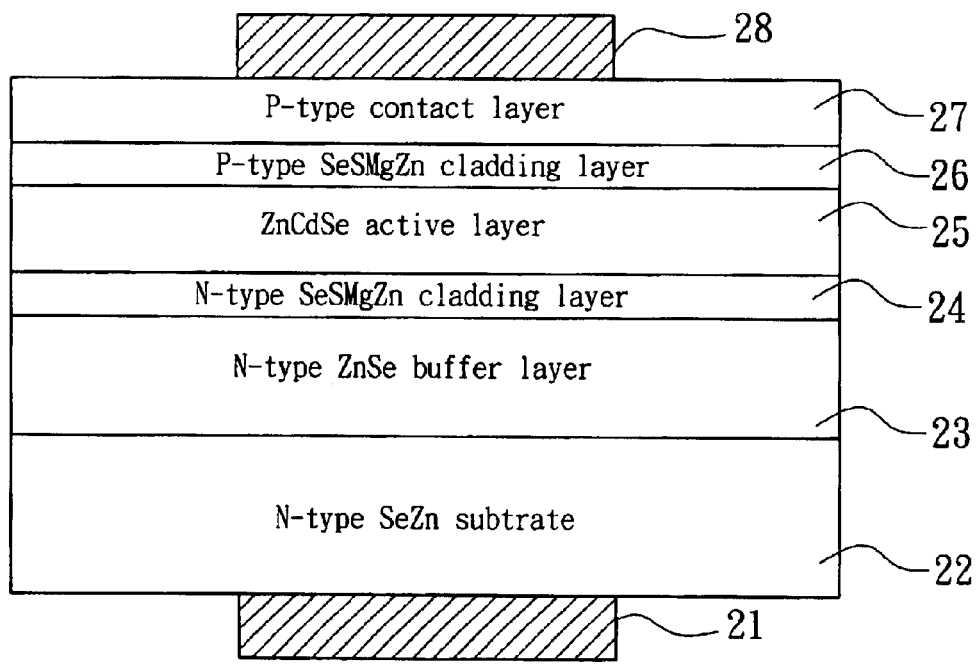
FIG. 2 (Prior Art) shows the cross section of LED of lateral-electrode type, wherein the P-type electrode and N-type electrode are positioned the different side of the substrate.
Figure 3:
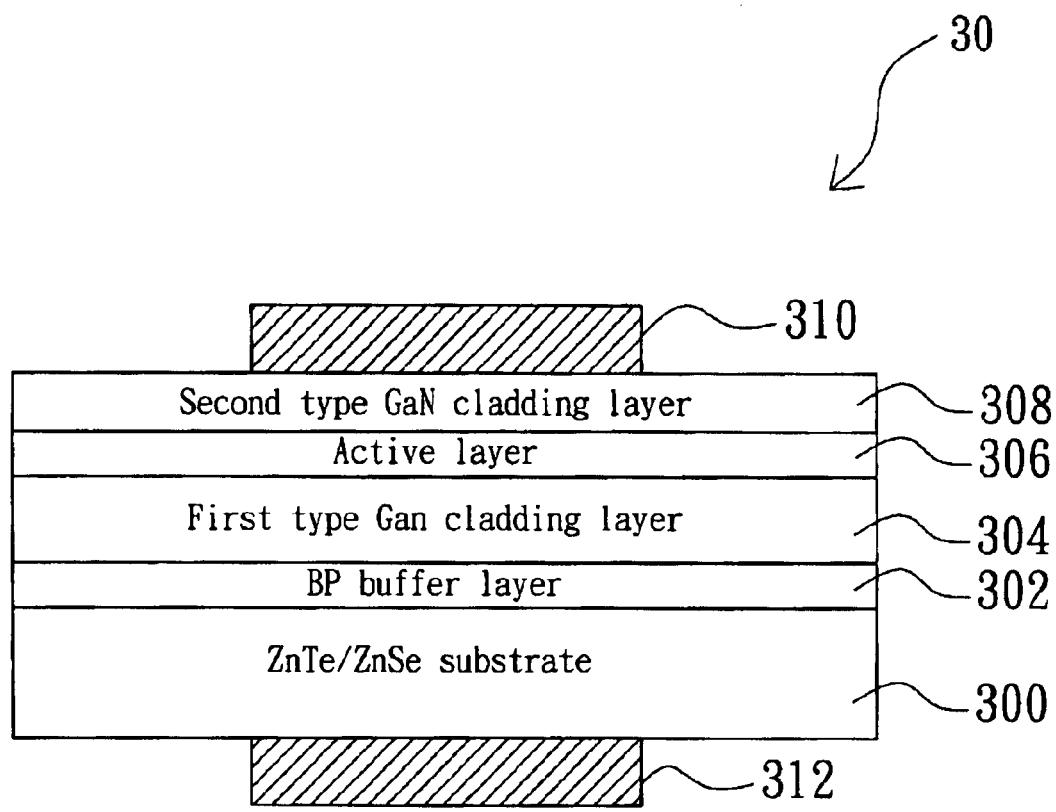
FIG. 3 shows the cross section of the light emitting diode (LED) structure of vertical-electrode type according to the embodiment of the present invention, wherein the two electrodes are formed on the different side of the substrate.

FIG. 3 shows the cross section of the light emitting diode (LED) 30 structure of vertical-electrode type according to the embodiment of the present invention, wherein the electrode 310 and the electrode 312 are positioned on the different side of substrate 300. With low temperature and then high temperature, a BP buffer layer 302 of single crystal is grown on a substrate 300, which is a P-type ZnTe substrate 300 in the present invention. Next, a first type GaN cladding layer 304, an active layer 306, a second type GaN cladding layer 308, and a second type electrode 310 are sequentially formed on the BP buffer layer 302. Moreover, a first type electrode 312 is formed below the P-type ZnTe substrate 300.

The present invention utilizes the P-type ZnTe material as the substrate 300, such that the first type electrode 312 can be formed below the substrate 300 to complete the structure of a vertical-electrode LED. Moreover, the P-type ZnTe material can absorb part of the blue light of 450 nm to 470 nm wavelength from the active layer 306, and emit yellow-green light of 550 nm. The mixing of yellow-green light and the blue light can produce a white light.

The P-type ZnTe material may be formed using a vertical gradient freeze (VGF) chamber full of $N_2$ gas and at a pressure of 20 atm. In the chamber, the Zn metal and the Te metal are mixed in a crucible. A precursor, such as $ZnP_2$, is needed in the crucible so as to introduce P-type dopant into the ZnTe material. The chamber temperature is then increased gradually to higher than the melting point of ZnTe (1295° C.). After homogenization, the temperature is decreased with the temperature gradient maintained at less than 10 K/cm, and the P-type ZnTe substrate 300 is thus formed.

Alternatively, the substrate 300 of the present invention can be composed of N-type ZnSe, which is formed by the chemical vapor transport (CVT) or iodine transport method. First, a polycrystal ZnSe is laid on the bottom of growth chamber, and a ZnSe seed crystal is fixed on the ceiling of the growth chamber. The chamber is filled with iodine vapor. Thereupon, the bottom polycrystal ZnSe is heated to a temperature T1. The ceiling seed crystal ZnSe is heated to a temperature T2 of about 850° C., wherein T2<T1. At the bottom of the chamber, the higher temperature T1 induces the following reaction:

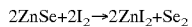

$2ZnSe+2I_2 \rightarrow 2ZnI_2+Se_2$ $ZnI_2$ and $Se_2$ vapor are produced and rise from the bottom of the chamber to the ceiling of the chamber. At the ceiling, $ZnI_2$ and the $Se_2$ are cooled by the seed ZnSe, and are converted into ZnSe by the above reverse reaction. The resultant ZnSe is deposited on the seed ZnSe with the same orientation, and the ZnSe single crystal thus grows upon the seed ZnSe. The $I_2$ vapor returns to the bottom for further reaction with ZnSe. The iodine $I_2$, which carries Zn from the bottom polycrystal to the ceiling single crystal, is naturally absorbed by the ZnSe in the growing process. The absorbed $I_2$ activates the ZnSe to an N-type material. Other dopants, such as Al, Cl, Br, Ga, and In, can also activate the ZnSe to an N-type material. These dopants can be used to control the wavelength of the yellow light after the ZnSe absorbs the blue light.

The ZnSe single crystal still has many Se vacancies. By heating the ZnSe single crystal up to about 1000° C., the ZnSe crystal is annealed for about 50 hours in Zn vapor atmosphere. Then, the ZnSe is cooled according to the rate of 60° C./min, such that an improved ZnSe single crystal is obtained.

Before the growth of the BP buffer layer 302, the substrate 300 is cleaned with proper chemical solvent. Then, the substrate 300 is heated to a temperature of 900° C. in the $H_2$ atmosphere to remove the native oxide. The BP buffer layer 302 on the substrate 300 is formed by halide vapor phase epitaxy. The carrier gas is $H_2$. The precursors are $BCl_3$ and $PCl_3$, or $BCl_3$ and $PH_3$. First, the epitaxy of the low-temperature BP layer of 400 nm is formed at a temperature of about 300° C. Then, the epitaxy of the high-temperature BP layer of 4560 nm is formed at a temperature of about 1000° C.

The BP is a zinc blende structure, and its crystal constant is about 4.538 Å. The GaN layer on the BP buffer layer 302 is also a zinc blende structure, and its crystal constant is about 4.51 Å. The crystal constant difference of these two layers is only 0.6%, such that the epitaxy of the GaN layer on the BP buffer layer 302 has perfect lattice matching.

The first type GaN cladding layer 304 has a cubic crystal structure. The composition of the first type cladding layer 304 is not limited to GaN. Other compositions, such as $Al_xIn_yGa_{1-x-y}N$ (0<x<1, 0<y<1, x+y=1), $Al_xGa_yN_{1-x-y}P$ (0<x<1, 0<y<1, x+y=1), InGaN, AlGaN, and GaNP, are also applicable in the present invention. The precursors to form the compositions described above are usually monomethyl hydrazine or $NH_3$. For example, consider the manufacturing of GaN. By using the precursors of monomethyl hydrazine (MMH) and trimethyl gallium (TMG), the first type GaN cladding layer 304 is formed on the BP buffer layer 302 by the metal organic vapor phase epitaxy (MOVPE) method.

The active layer 306 on the first type GaN cladding layer 304 is a cubic crystal structure, and may comprise a semiconductor of the GaN group, such as $In_yGaN$, 0<y<1. With trimethyl indium (TMIn), trimethyl gallium (TMG), and $NH_3$ as the precursors, the $In_yGaN$ can be formed by the MOCVD method. When y equals 0.1, the active layer emits UV light of 405 nm; when y equals 0.2, the active layer emits blue light of 470 nm.

The second type GaN cladding layer 308 on the active layer 306 is also a cubic crystal structure, and may be formed using the same method of the first type GaN cladding layer 304.

The first type electrode 312 is positioned on the lower surface of the substrate 300 and the second type electrode 310 is positioned on the upper surface of the second type GaN cladding layer 308.

In order to increase the conductivity of the LED 30, the resistance of the first type GaN cladding layer 304 is decreased with dopants. A dopant of the IIA group, such as Mg, activates the first type GaN cladding layer 304 to a P-type material, and a dopant of the IVA group, such as Si, activates the first type GaN cladding layer 304 to an N-type material. The P-type and an N-type BP buffer layer 302 are respectively formed by adjusting the P-Rich and B-Rich structures. Please note that the conducting types of the substrate 300, the BP buffer layer 302 and the first type GaN cladding layer 304 are required to be the same as the first type electrode 312.

The conductivity of the second type GaN cladding layer 308 can also be decreased with dopants. A dopant of the IIA group, such as Mg, activates the second type GaN cladding layer 308 to a P-type material; a dopant of the IVA group, such as Si, activates the second type GaN cladding layer 308 to an N-type material. The conducting types of the substrate 300, the BP buffer layer 302, the first type GaN cladding layer 304 and the first type electrode 312 are opposite to that of the second type cladding layer 308 and the second type electrode 310.

For the preferred embodiment of the present invention, the first type electrode 312, as well as the substrate 300, the BP buffer layer 302, and the first type GaN cladding layer 306 are P-type material. The second type electrode 310 and the second type GaN cladding layer 308 are N-type material.

From the above description, the present invention provides an LED structure of vertical-electrode type. When appropriate voltages are applied to the first type electrode and the second electrode, the active layer 306 at the P-N junction will emit blue light of a wavelength from 450 nm to 470 nm. The ZnTe layer or ZnSe substrate absorbs the blue light, and emits yellow-green light of 550 nm. A suitable ratio between the unabsorbed blue light and the yellow-green light will produce white light.

The substrate used in the traditional method is limited to group III-V and IV semiconductors, such as sapphire, GaP, InP and GaAs. Instead, the present invention utilizes the II-VI group, such as ZnTe and ZnSe, as the substrate 300. Moreover, to lattice match between the II-VI group substrate and the following GaN cladding layers of III-V group, a buffer layer of single crystal is used in the present invention. Thereby the quality of the LED can be improved, as well as its longevity.

While the invention has been described by way of example and in terms of the preferred embodiment, it is to be understood that the invention is not limited to the disclosed embodiment. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode (LED) capable of emitting white light comprising:

a ZnTe substrate;

a BP buffer layer of single crystal on said ZnTe substrate;

a first type GaN cladding layer of cubic crystal on said BP buffer layer;

an active layer on said first type GaN cladding layer; and a second type GaN cladding layer of cubic crystal on said active layer, wherein the conducting type of said second type GaN cladding layer is opposite to said first type GaN cladding layer, said active layer emitting a first wavelength, said ZnTe substrate emitting a second wavelength by absorbing said first wavelength, such that the wavelength of said white light is produced by mixing said first wavelength and said second wavelength.

2. The LED capable of emitting white light according to claim 1, further comprising:

a first type electrode below said ZnTe substrate; and a second type electrode on said second type GaN cladding layer and having opposite conducting type to said first type electrode.

3. The LED capable of emitting white light according to claim 1, wherein said ZnTe substrate, said BP buffer layer, said first type electrode and said first type GaN cladding layer are the same in conducting type.

4. The LED capable of emitting white light according to claim 3, wherein said ZnTe substrate is N-type or P-type.

5. The LED capable of emitting white light according to claim 4, wherein said BP buffer layer may be P-type or N-type by respectively adjusting the P-Rich or B-Rich structures.

6. A light emitting diode (LED) capable of emitting white light comprising:

a ZnSe substrate;

a BP buffer layer of single crystal on said ZnSe substrate;

a first type GaN cladding layer of cubic crystal on said BP buffer layer;

an active layer on said first type GaN cladding layer; and a second type GaN cladding layer of cubic crystal on said active layer, wherein the conducting type of said second type GaN cladding layer is opposite to said first type GaN cladding layer, said active layer emitting a first wavelength, said ZnSe substrate emitting a second wavelength by absorbing said first wavelength, such that the wavelength of said white light being produced by mixing said first wavelength and said second wavelength.

7. The LED capable of emitting white light according to claim 6, further comprising:

a first type electrode below said ZnSe substrate;

a second type electrode on said second type GaN cladding layer and having opposite conducting type to said first type electrode.

8. The LED capable of emitting white light according to claim 6, wherein said ZnSe substrate, said BP buffer layer, said first type electrode and said first type GaN cladding layer are the same in conducting type.

9. The LED capable of emitting white light according to claim 8, wherein said ZnSe substrate is N-type or P-type.

10. The LED capable of emitting white light according to claim 6, wherein said BP buffer layer may be P-type or N-type respectively by adjusting the P-Rich structure or the B-Rich structure.

* * * * *